United States Patent
Kim et al.

(10) Patent No.: US 7,112,506 B2
(45) Date of Patent: Sep. 26, 2006

(54) METHOD FOR FORMING CAPACITOR OF SEMICONDUCTOR DEVICE

(75) Inventors: Gyu Hyun Kim, Seoul (KR); Hyo Geun Yoon, Kyoungki-do (KR); Geun Min Choi, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 187 days.

(21) Appl. No.: 10/878,747

(22) Filed: Jun. 28, 2004

(65) Prior Publication Data

US 2005/0202645 A1 Sep. 15, 2005

(30) Foreign Application Priority Data

Mar. 10, 2004 (KR) ............... 10-2004-0016196

(51) Int. Cl.
*H01L 21/20* (2006.01)
(52) U.S. Cl. ............... 438/387; 438/389; 438/397; 438/398
(58) Field of Classification Search ............... 438/386, 438/387, 389, 396, 397, 398
See application file for complete search history.

(56) References Cited

U.S. PATENT DOCUMENTS

| | | | |
|---|---|---|---|
| 6,015,735 A * | 1/2000 | Shue et al. ............... 438/254 |
| 6,222,722 B1 * | 4/2001 | Fukuzumi et al. ............ 361/305 |
| 6,548,348 B1 * | 4/2003 | Ni et al. ............... 438/253 |
| 6,548,853 B1 * | 4/2003 | Hwang et al. ............ 257/306 |
| 6,784,068 B1 * | 8/2004 | Lee et al. ............... 438/396 |
| 6,849,497 B1 * | 2/2005 | Hashimoto ............... 438/244 |
| 6,930,014 B1 * | 8/2005 | Kim et al. ............... 438/396 |
| 2002/0025678 A1 * | 2/2002 | Chen et al. ............... 438/694 |
| 2005/0116318 A1 * | 6/2005 | Park ............... 257/532 |

* cited by examiner

*Primary Examiner*—Zandra V. Smith
*Assistant Examiner*—Seth Barnes
(74) *Attorney, Agent, or Firm*—Ladas & Parry LLP

(57) ABSTRACT

Disclosed is a method for forming a capacitor of a semiconductor device. An etch stop layer, first oxide layer and second oxide layer are sequentially deposited on an insulating interlayer of a substrate. Contact holes through which portions of the etch stop layer are exposed above plugs of the insulating interlayer are formed. The contact holes are cleaned by a cleaning solution having an etching selectivity which is higher for the first oxide layer than for the second oxide layer, thereby enlarging lower portions of the contact holes. A spacer nitride layer is formed on surfaces of the contact holes and the second oxide layer. Portions of the spacer nitride layers located on the second oxide layer and above the plugs together with portions of the etch stop layer located on the plugs are removed. A double polysilicon layer is formed on the spacer nitride layer segments.

9 Claims, 16 Drawing Sheets

METHOD FOR FORMING CAPACITOR OF SEMICONDUCTOR DEVICE

BACKGROUND OF THE INVENTION

1. Field of the Invention

The present invention relates to a method for forming a capacitor of a semiconductor device, and more particularly to a method for forming a capacitor of a semiconductor device, which can suppress formation of bridges between lower electrodes of the capacitor, and can improve various characteristics of the capacitor, in relation to leakage current, capacitance, and breakdown voltage of the capacitor.

2. Description of the Prior Art

As generally known in the art, Dynamic RAMS (DRAMs) store data without being directly and constantly connected to power source, and so they should be refreshed at regular intervals. In other words, DRAMs store data in the form of charge on capacitors, and so require that the capacitors be recharged regularly: every few milliseconds. Further, the larger the capacitance of the capacitors is, the longer the data stored in the DRAMs can be maintained.

However, a recent trend toward a higher integration of semiconductor devices induces reduction in the cell size, accompanied by reduction in the area of capacitors, which results in reduction in capacitance of the capacitors. Therefore, the conventional capacitor construction has difficulties in enabling the capacitors to retain necessary capacitance for maintenance of constant device operation characteristics.

Therefore, various types of highly integrated devices are currently mass-produced, such as devices having lower electrodes (i.e., charge storage electrodes) of various three-dimensional structures in order to increase the surface area, devices having a dielectric layer made from material having a high dielectric constant, or devices having as thin a dielectric layer as possible, in order to secure more than a certain amount of capacitance necessary for cell operation. Such mechanical features of the devices as described are based on a principle that a capacitance of a capacitor is proportional to either a surface area of an electrode or a dielectric constant of a dielectric layer, and is inversely proportional to a spacing between the lower and upper electrodes, i.e., a thickness of the dielectric layer.

Specifically, first, in order to secure a necessary capacitance, the thickness of the dielectric layer or the spacing between the upper and lower electrodes may be reduced. For example, an ONO film lamination (oxide film/nitride film/oxide film) intends to increase a capacitance through reduction in the thickness of the dielectric layer. Second, the dielectric layer may be made from material having a high dielectric constant in order to increase the capacitance. For example, dielectric films of $Ta_2O_2$, TaON, and $Al_2O_3$ intend to increase a capacitance by employing a dielectric layer made from material having a high dielectric constant. Third, various three dimensional structures of the lower electrodes, such as cylindrical structures, concave structures, and pin-shaped structures, intend to increase a capacitance by increasing the surface area of the electrodes. For example, U.S. Pat. No. 5,655,536 discloses a crown-shaped stacked capacitor, and U.S. Pat. No. 5,716,884 discloses a stacked capacitor having a fin-shaped electrode. In contrast, U.S. Pat. No. 5,877,052 discloses a method of increasing a capacitance of a capacitor by forming hemispherical silicon grains on surfaces of lower electrodes.

Here, in the method of forming the lower electrodes with the hemispherical silicon grains grown on the surfaces of the lower electrodes, silicon grains are deposited and heat-treated on the surfaces of the lower electrodes, so as to cause the surfaces of the lower electrodes to be flexural, thereby increasing the surface area of the lower electrodes and securing the necessary capacitance. The step of forming the hemispherical silicon grains is also called a "meta-stable polysilicon (MPS) process." When the MPS process has been performed to cause the surfaces of the lower electrodes to be flexural, thereby increasing the surface area of the lower electrodes, the capacitance can be increased up to a value about twice larger than that of a capacitor having flat electrodes. However, the capacitor having flexural electrodes shows an inferior characteristic in relation to current leakage and has a limitation in that a film having excellent step coverage have to be inevitably used as a dielectric layer in the following step.

FIGS. 1a through 1f are cross-sectional views showing a process of forming a conventional capacitor, which will be described hereinafter.

In the step as shown in FIG. 1a, a semiconductor substrate 11 on which an insulating interlayer 12 having plugs 13 is formed is firstly arranged. Then, an etch stop layer 14, an oxide layer 15, and a hard mask layer 16 are deposited in sequence on the insulating interlayer 12.

In the step as shown in FIG. 1b, a photoresist film is applied on the hard mask layer 16 and is then exposed to light and developed, so as to form a photoresist pattern defining a region in which lower electrodes shall be formed. Thereafter, the hard mask layer and the oxide layer 15 are etched while using the photoresist pattern as an etching barrier, so as to form contact holes 17 through which the etch stop layer 14 is exposed. Thereafter, the photoresist pattern and the hard mask layer are eliminated in sequence.

In the step as shown in FIG. 1c, polymers generated when the contact holes 17 are formed are eliminated, and the insides of the contact holes 17 are cleaned so as to increase an effective surface area of the region in which the lower electrodes shall be formed. Here, diluted hydrogen fluoride (DHF) solution or buffered oxide etchant (BOE) solution is used in the cleaning. Thereafter, portions of the etch stop layer 14 under the contact holes 17 are eliminated, so as to expose the plugs 13.

In the step as shown in FIG. 1d, a double polysilicon layer 18 used to form the lower electrodes is deposited on the exposed surfaces of the oxide layer 15 and the inside surfaces of the contact holes 17. Herein, the double polysilicon layer 18 has a dual structure including a doped polysilicon layer 18a and an undoped polysilicon layer 18b.

In the step as shown in FIG. 1e, another photoresist film is applied to fill the contact holes in which the double polysilicon layer 18 for the lower electrodes is formed. Then, the photoresist film is etched back or subjected to a chemical mechanical polishing (CMP), so as to divide the double polysilicon layer 18 into a plurality of adjacent polysilicon layer segments for the lower electrodes. Thereafter, the photoresist film is eliminated through a stripping process, and the resultant lamination on the substrate is then cleaned.

In the step as shown in FIG. 1f, the hemispherical silicon grains 19 are developed on surfaces of the segments of the undoped polysilicon layer 18b, so as to form the lower electrodes.

Thereafter, although not shown, a dielectric film and an upper electrode are formed in sequence on the lower electrodes having the hemispherical silicon grains 19 formed on the surfaces thereof, thereby completing a capacitor.

However, such a conventional method for forming a capacitor of a semiconductor device as described above has several problems as follows.

FIG. 2a is a photograph showing the contact holes which are in a state after being cleaned after being formed by etching an oxide layer. The cleaning is performed in order to increase the effective surface area of the region in which the lower electrodes shall be formed and eliminate the polymers remaining after the etching. However, FIG. 2a shows a capacitor in which the oxide layer is insufficiently etched and remains at lower portions of the contact holes, thereby failing to achieve actual increase in the effective surface area of the region in which the lower electrodes shall be formed. Herein, when a quantity of the etched oxide layer is increased, the space between cells may become insufficient and bridges may be formed between cells. In contrast, it is nearly impossible to increase the capacitance of the capacitor when the etching is carried out in such a degree as to prevent bridges from being formed between cells.

FIGS. 2b and 2c are photographs of a lamination formed on a substrate, including hemispherical silicon grains developed thereon, taken from above and side of the lamination.

In partially eliminating the polysilicon layer for the lower electrodes deposited on the oxide layer in order to form the electrically separated lower electrodes, a photoresist film is applied to fill the contact holes, and then, the photoresist film is etched back to eliminate the polysilicon layer for the lower electrodes deposited on the oxide layer.

Here, the difference between the etching rates of the oxide layer and the polysilicon layer for the lower electrodes may cause loss of an upper portion of the oxide layer, which causes the polysilicon layer segments for the lower electrodes to protrude outward beyond the oxide layer. As a result, the excessively protruding polysilicon layer segments for the lower electrodes may induce excessive development of hemispherical silicon grains, and may induce formation of hemispherical silicon grains even on outer wall surfaces of the lower electrodes.

FIG. 2d illustrates graphs showing diffusion of phosphorus P from the doped polysilicon layer to the undoped polysilicon layer when the lamination has been subjected to an annealing at 650° C. in order to grow the hemispherical silicon grains on the undoped polysilicon layer. Here, a doped polysilicon layer having a thickness of 300 Å and an undoped polysilicon layer having a thickness of 100 Å and doped with phosphorus at a density of 24E20 atoms/cc were employed in the experiment as shown in the graphs of FIG. 2d.

As a result of the annealing, the entire doping profile shows no change, but it is noted that the diffusion of the phosphorus has lowered the doping density at the surface of the doped polysilicon layer down to 1E19~1E18 atoms/cc.

As described above, in order to increase growth of hemispherical silicon grains, the undoped silicon for the lower electrodes is deposited with an increased thickness, and the hemispherical silicon grains are grown on the undoped silicon layer. Then, the hemispherical silicon grains are excessively grown and phosphorus is diffused in the doped polysilicon layer, thereby causing a thinning phenomenon, in which the thickness of the doped polysilicon layer is reduced. As a result, pinholes are formed in the doped polysilicon layer, and cleaning solution may come into the pinholes and etch the oxide layer, thereby forming holes in the oxide layer, in the following cleaning step. Consequently, in the following step of depositing the dielectric film, the dielectric film may be deposited in the entire holes so as to form bridges between cells.

FIG. 2e is a photograph showing pinholes formed in the doped polysilicon layer according to the thinning phenomenon, that is, reduction of the thickness of the doped polysilicon layer.

Here, the pinholes formed while the hemispherical silicon grains are grown degrade various characteristics of the capacitor, in relation to leakage current, capacitance, and breakdown voltage of the capacitor.

SUMMARY OF THE INVENTION

Accordingly, the present invention has been made to solve the above-mentioned problems occurring in the prior art, and an object of the present invention is to provide a method for forming a capacitor of a semiconductor device, which can increase an effective surface area of lower electrodes of the capacitor.

It is another object of the present invention to provide a method for forming a capacitor of a semiconductor device, which can prevent excessive growth of silicon grains in the capacitor.

It is still another object of the present invention to provide a method for forming a capacitor of a semiconductor device, which can prevent formation of bridges between cells according to a thinning phenomenon of the doped polysilicon layer.

In order to accomplish this object, there is provided a method for forming a capacitor of a semiconductor device, the method comprising the steps of: providing a semiconductor substrate on which an insulating interlayer having plugs is formed; depositing an etch stop layer, a first oxide layer, and a second oxide layer in sequence on the insulating interlayer; etching the second oxide layer and the first oxide layer, thereby forming contact holes through which portions of the etch stop layer above the plugs are exposed; cleaning the contact holes by a cleaning solution having an etching selectivity, which is higher for the first oxide layer than for the second oxide layer, thereby enlarging lower portions of the contact holes; forming a spacer nitride layer on surfaces of the contact holes and the second oxide layer; removing portions of the spacer nitride layers located on the second oxide layer and above the plugs together with portions of the etch stop layer located on the plugs; forming a double polysilicon layer on the spacer nitride layer segments formed on surfaces of the contact holes and on the second oxide layer, the double polysilicon layer consisting of a doped polysilicon layer and an undoped polysilicon layer stacked on each other; applying a photoresist film on the double polysilicon layer; etching back the photoresist film and the double polysilicon layer, thereby eliminating the portions of the double polysilicon layer on the second oxide layer; removing the remained photoresist film; growing hemispherical silicon grains on surfaces of segments of the undoped polysilicon layer, thereby forming lower electrodes; and forming a dielectric layer and an upper electrode in sequence on the lower electrodes.

The first oxide layer is one selected from the group consisting of a phosphor silicate glass (PSG) film, a borophosphor silicate glass (BPSG) film, or an undoped silicate glass (USG) film, each containing impurities, and the second oxide layer is a tetra ethyl ortho silicate (TEOS) film containing no impurity. The first oxide layer has a thickness smaller than 50% of a sum of thicknesses of the first oxide layer and the second oxide layer.

In step 4), the contact holes are cleaned by a mixture solution of $NH_4OH$ having a concentration of 29 wt %, $H_2O_2$ having a concentration of 31 wt %, and a deionized water $H_2O$. Herein, the mixture solution contains $NH_4OH$, $H_2O_2$, and $H_2O$ mixed at a volumetric ratio of 1:1~5:20~50 and is used at a temperature between 25 and 85° C.

In step 4), the contact holes may be cleaned by HF solution diluted with $H_2O$ or isopropyl alcohol (IPA). Here, in the HF solution diluted with $H_2O$ or IPA, the ratio of $HF:H_2O$ or HF:IPA is 1:1000~1:10.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
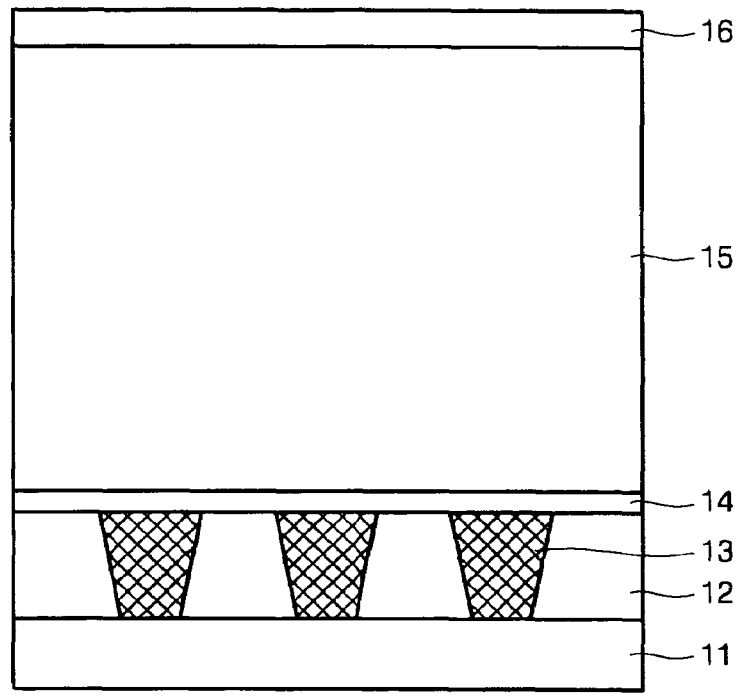
FIGS. 1a through 1f are cross-sectional views showing a process of forming a conventional capacitor.
Figure 1B:
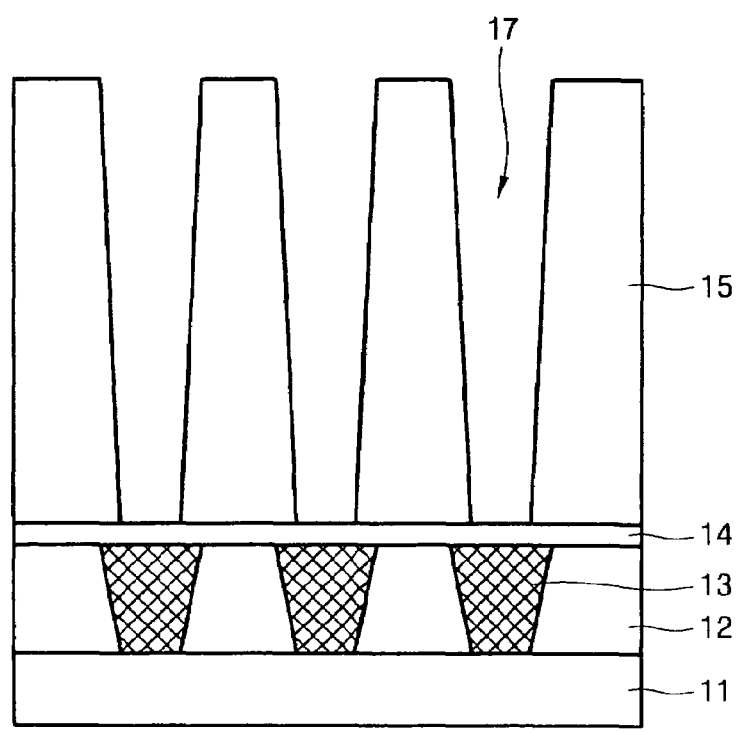
Figure 1C:
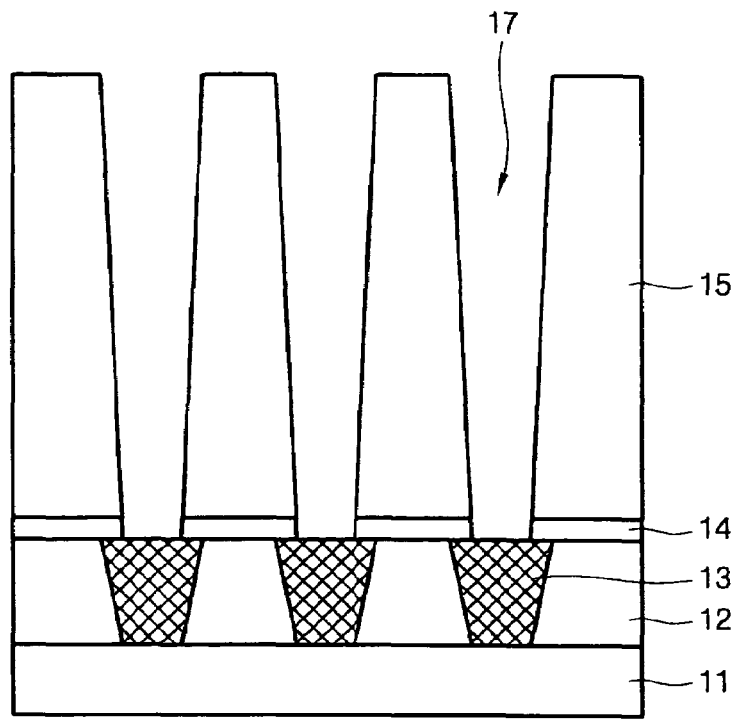
Figure 1D:
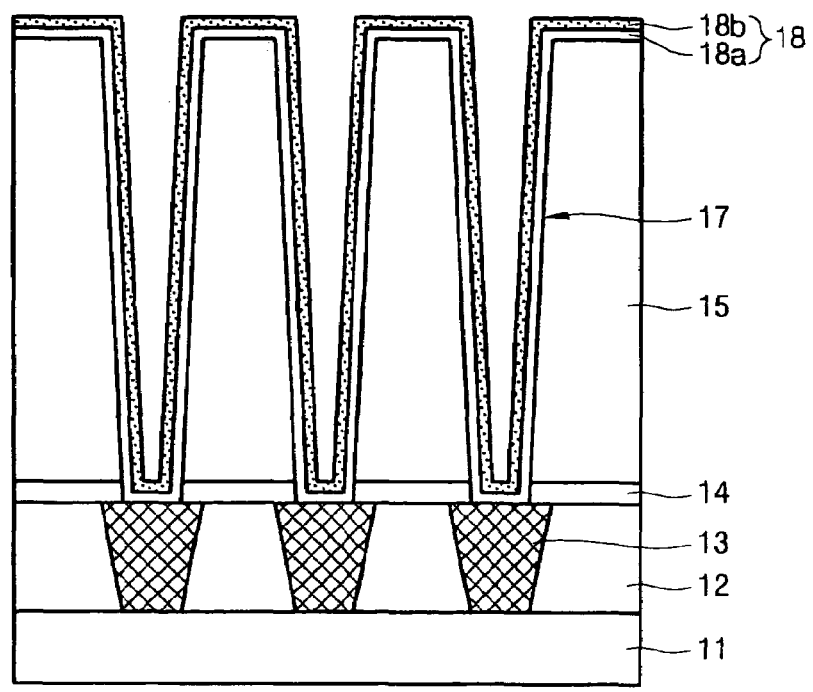
Figure 1E:
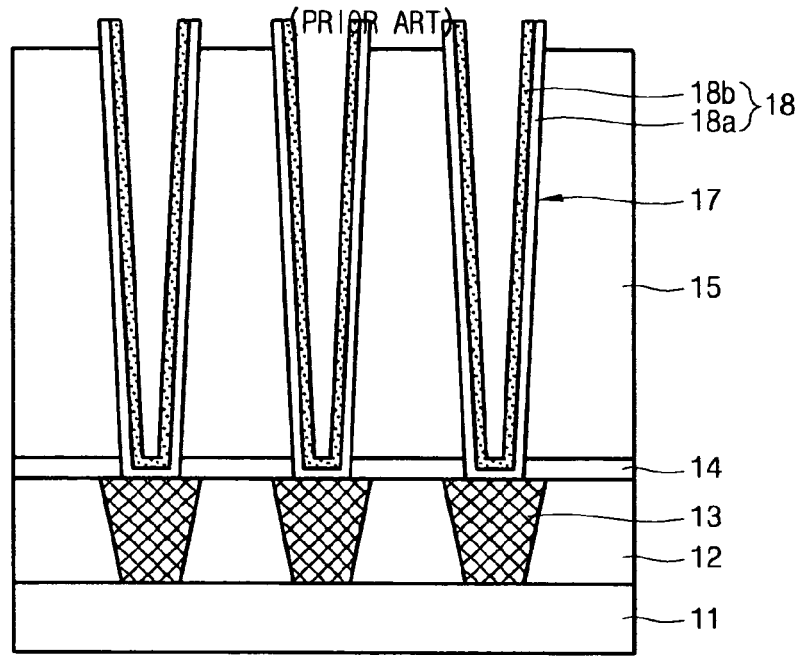
Figure 1F:
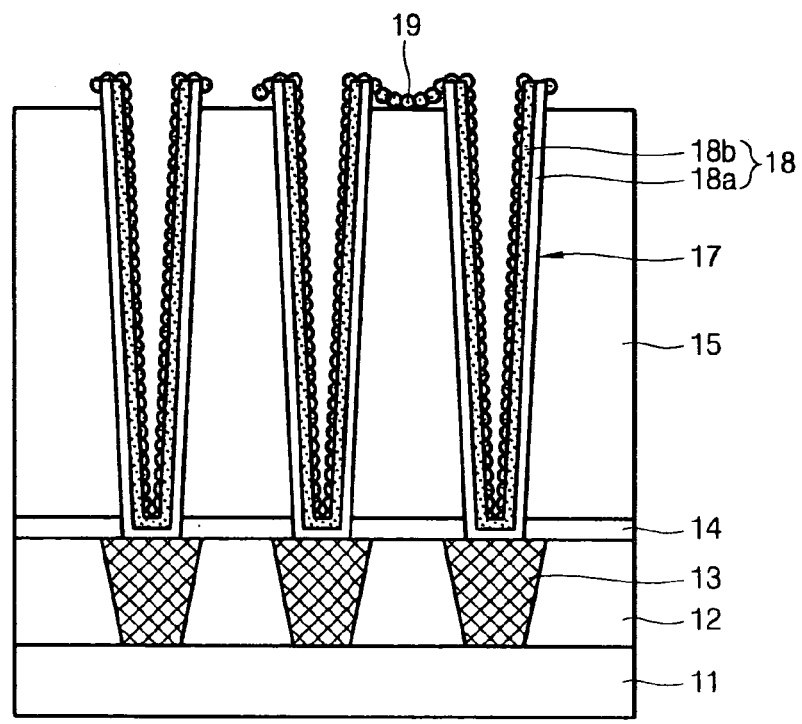
Figure 2A:
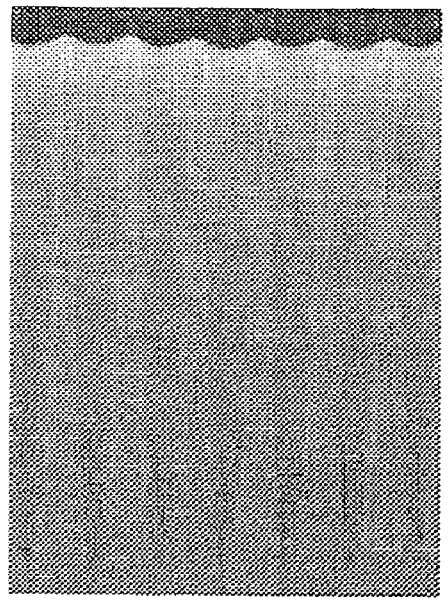
FIGS. 2a through 2e are photographs and graphs for describing problems of a conventional process of forming a capacitor of a semiconductor.
Figure 2B:
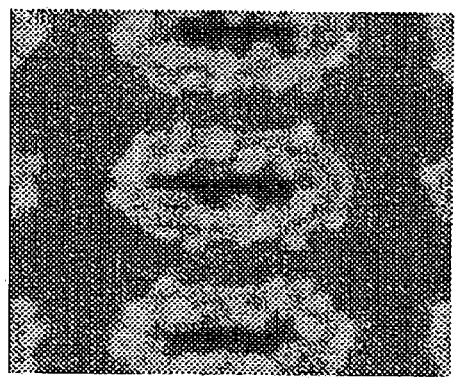
Figure 2C:
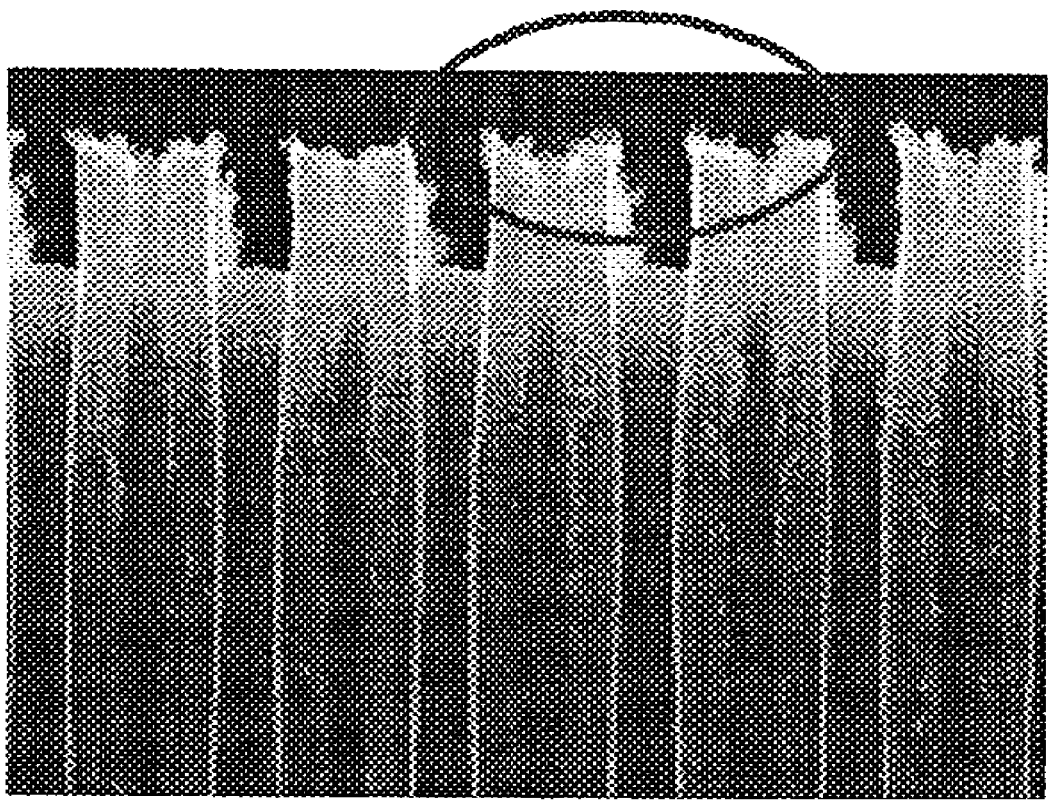
Figure 2D:
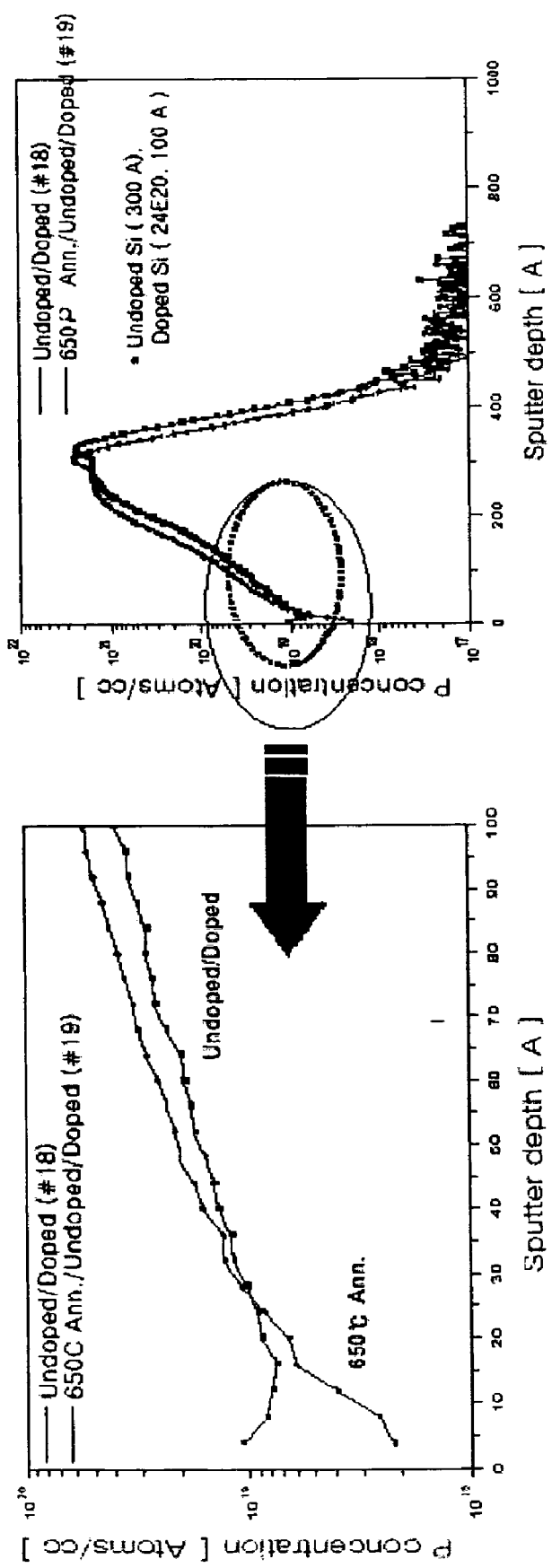
Figure 2E:
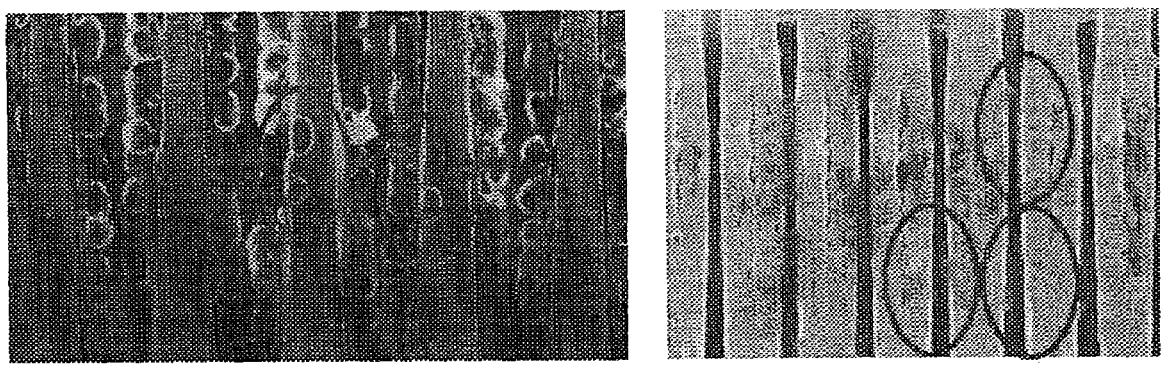

Hereinafter, a preferred embodiment of the present invention will be described with reference to the accompanying drawings. In the following description and drawings, the same reference numerals are used to designate the same or similar components, and so repetition of the description on the same or similar components will be omitted.

FIGS. 3a through 3h are cross-sectional views sequentially showing steps of a process of forming a capacitor according to the present invention.

Figure 3A:
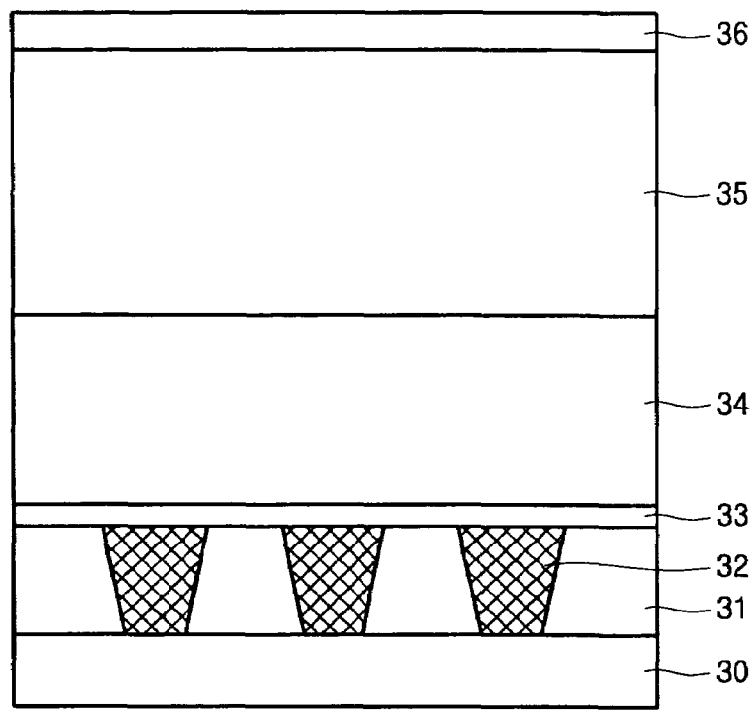
FIGS. 3a through 3h are cross-sectional views sequentially showing steps of a method of forming a capacitor according to the present invention.

In the step shown in FIG. 3a, an insulating interlayer 31 having plugs 32 is formed on a semiconductor substrate 30 according to a known process. Then, an etch stop layer 33, a first oxide layer 34, a second oxide layer 35, and a hard mask layer 36 are formed in sequence on the insulating interlayer 31 having the plugs 32.

Preferably, the etch stop layer 33 is a nitride film having a thickness of 400~1000 Å. Also, the first oxide layer 34 is a phosphor silicate glass (PSG) film, a boro-phosphor silicate glass (BPSG) film, or an undoped silicate glass (USG) film, each containing impurities. Further, the second oxide layer 35 is formed by depositing a tetra ethyl ortho silicate (TEOS) film, etc., containing no impurity, according to a method such as a plasma enhanced chemical vapor deposition (PECVD). This intends to facilitate etching and improve stability of structure in response to the increase in the thickness of the oxide layer in order to increase the effective surface area of the lower electrodes. Here, it is preferred that the first oxide layer 34 has a thickness smaller than 50% of the sum of the thicknesses of the first oxide layer 34 and the second oxide layer 35.

Figure 3B:
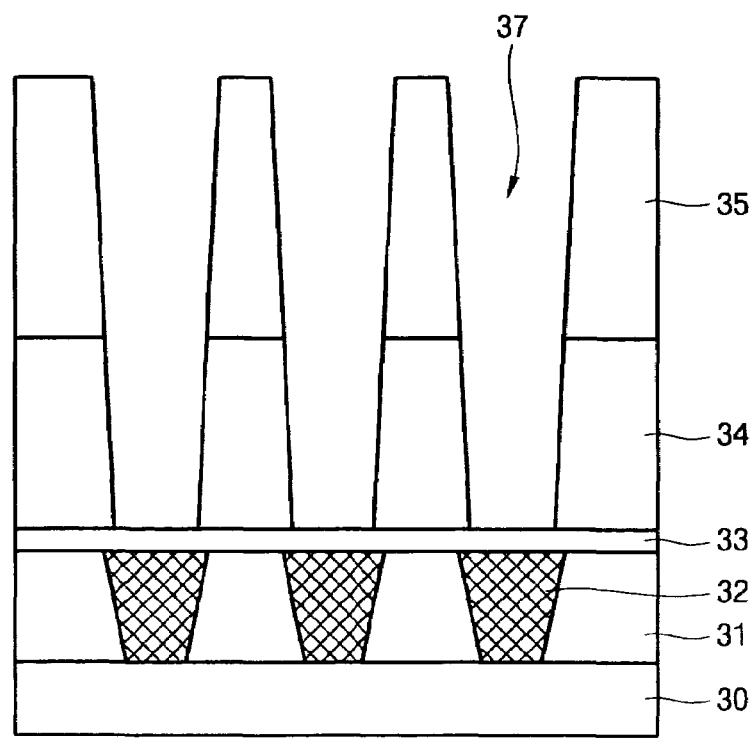

In the step shown in FIG. 3b, a photoresist film is applied on the hard mask layer and is then exposed to light and developed, so as to form a photoresist pattern defining a region in which lower electrodes shall be formed. Thereafter, the hard mask layer is etched using the photoresist pattern, and the second oxide layer 35 and the first oxide layer 34 are sequentially etched using the photoresist pattern as an etching barrier, so as to form contact holes 37 through which the etch stop layer 33 is exposed. Here, the sequential etching of the second oxide layer 35 and the first oxide layer 34 reduces trouble in the etching. Thereafter, the photoresist pattern and the hard mask layer are eliminated in sequence.

Figure 3C:
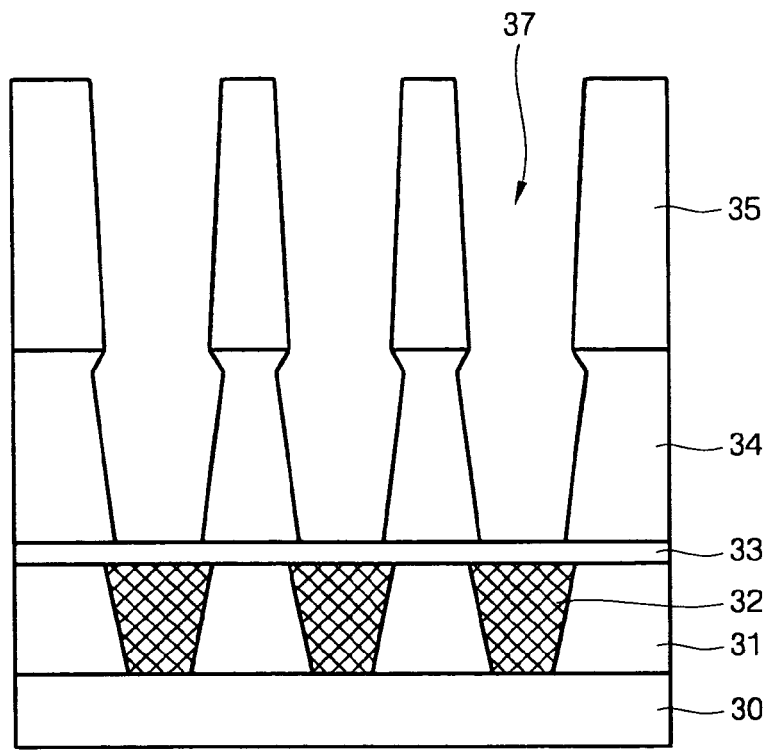

In the step shown in FIG. 3c, surfaces of the contact holes 37 are cleaned by predetermined cleaning solution, in order to eliminate wastes generated during the etching and increase an effective surface area of the region in which the lower electrodes shall be formed.

In general, when a single oxide layer is cleaned, a lower portion of the oxide layer is not cleaned, so that it is not easy to increase the surface area. In contrast, when a double oxide layer is cleaned using a cleaning solution having an etching selectivity which is higher for the first oxide layer 34 containing impurities of a higher concentration than for the second oxide layer 35 containing impurities of a lower concentration, the first oxide layer 34 at a lower position can be easily etched, so that the effective surface area of the lower electrodes can be actually increased. Further, bridges between adjacent oxide layers, which may be generated due to excessive etching in order to increase the surface area of the contact holes 37 deepen according to the reduction in the sizes of the devices, can be suppressed.

Here, as the cleaning solution, a mixture solution of $NH_4OH$ having a concentration of 29 wt %, $H_2O_2$ having a concentration of 31 wt %, and a deionized water $H_2O$ having a resistivity of at least 18.2 MΩ.cm is preferably used. Herein, it is preferred that the volumetric ratio of $NH_4OH$: $H_2O_2$:$H_2O$ is 1:1~5:20~50 and the mixture solution has a temperature between 25 and 85° C.

Further, as the cleaning solution, HF diluted with $H_2O$ or isopropyl alcohol (IPA) may used. Here, in the HF diluted with $H_2O$ or HF diluted with IPA, the ratio of $HF:H_2O$ or HF:IPA is preferably 1:1000~1:10.

Also, the cleaning can be performed using an anhydrous HF gas instead of a cleaning solution.

Figure 3D:
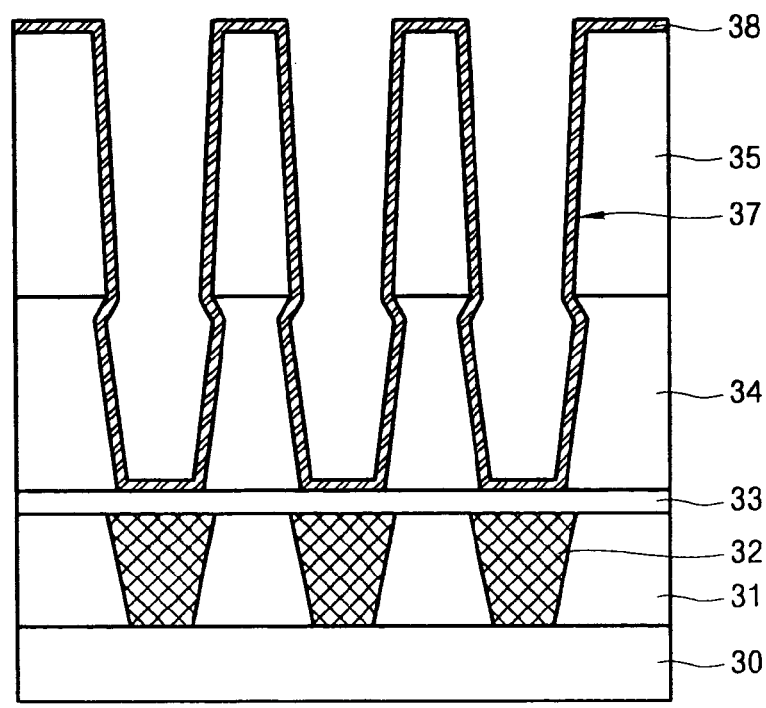

In the step shown in FIG. 3d, a spacer nitride layer 38 is deposited with a thickness of 30~100 Å at a temperature between 550 and 650° C. on the surfaces of the contact holes 37 and on the second oxide layer 35.

Figure 3E:
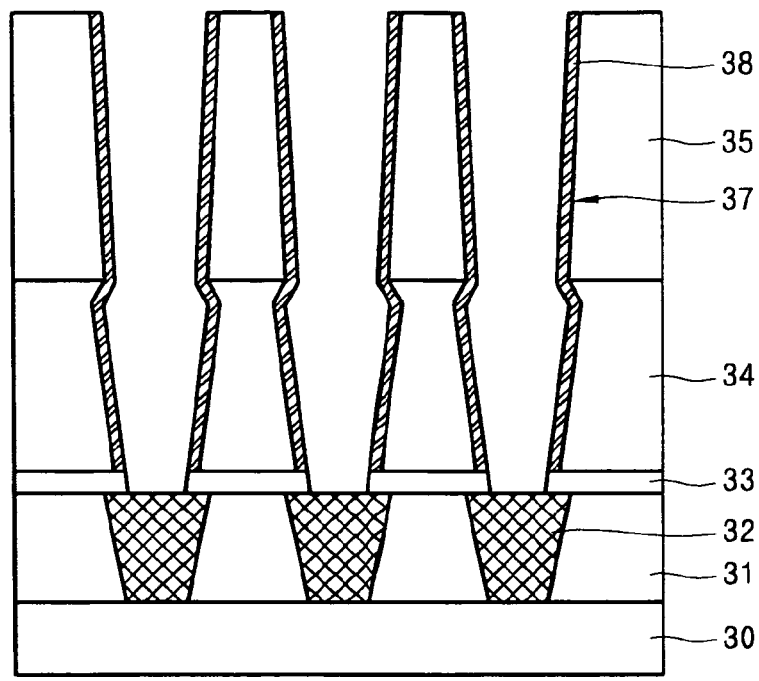

In the step shown in FIG. 3e, the resultant lamination on the substrate after the deposition is etched, so as to eliminate portions of the spacer nitride layer 38 on the second oxide layer 35 and portions of the spacer nitride layer 38 and the etch stop layer 33 on the plugs 32.

Figure 3F:
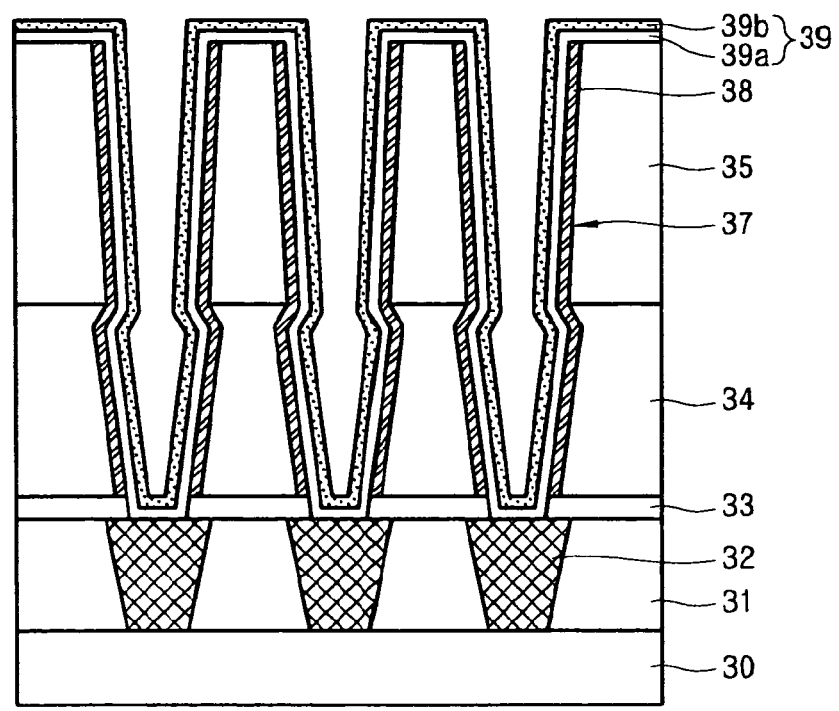

In the step shown in FIG. 3f, a double polysilicon layer 39 for the lower electrodes, which consists of a doped polysilicon layer 39a and an undoped polysilicon layer 39b stacked on each other, is formed on the second oxide layer 35 and on segments of the spacer nitride layer 38 formed on the surfaces of the contact holes 37.

Figure 3G:
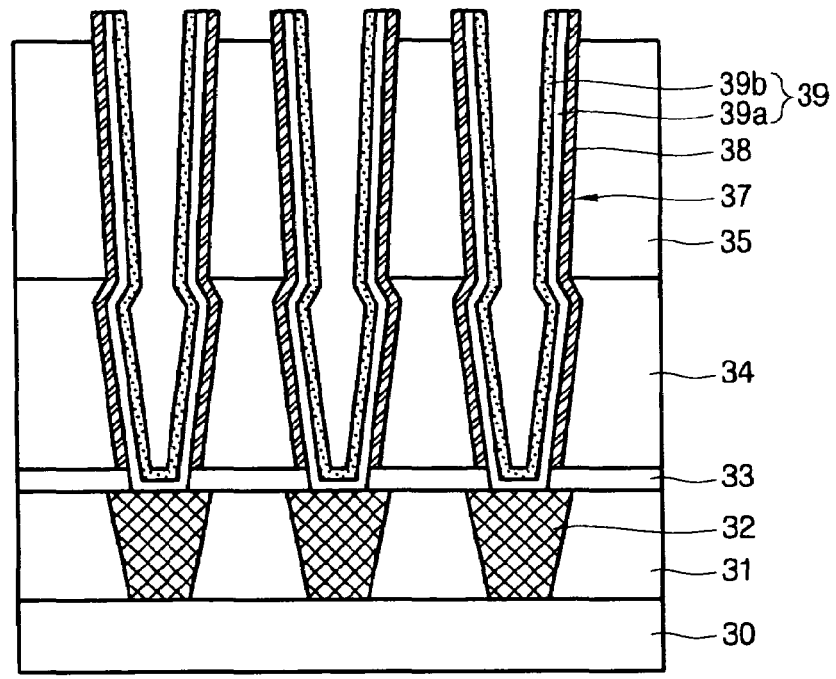

In the step shown in FIG. 3g, another photoresist film is applied on the double polysilicon layer 39 for the lower electrodes to fill the contact holes 37. Then, the photoresist film and the double polysilicon layer 39 for the lower electrodes are etched back, so as to eliminate the portions of the double polysilicon layer 39 on the second oxide layer 35. Thereafter, the photoresist film is removed through a stripping process, and the resultant lamination on the substrate is then cleaned.

Figure 3H:
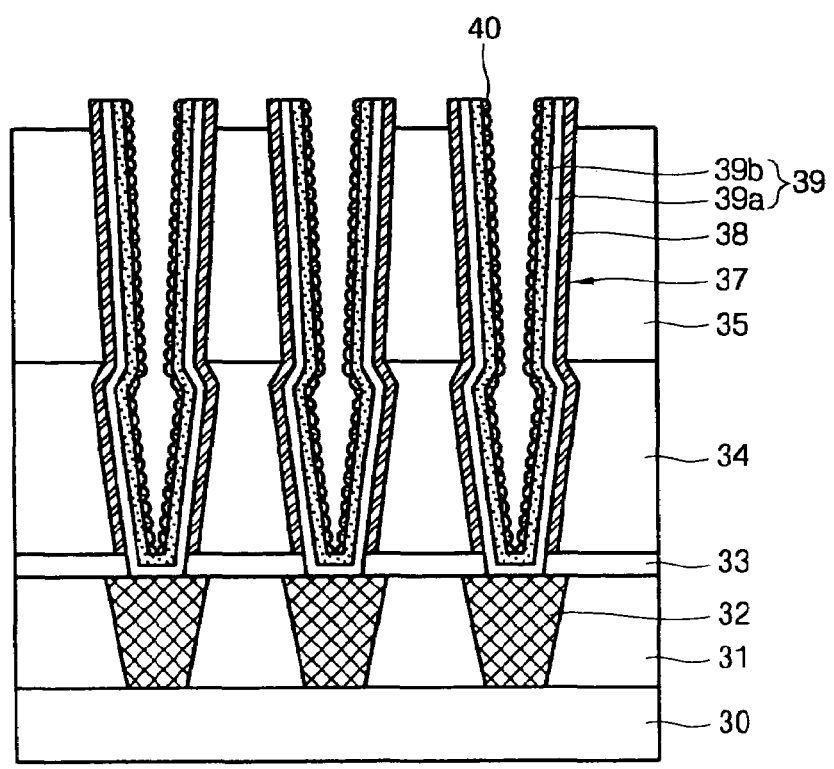

In the step shown in FIG. 3h, hemispherical silicon grains 40 are grown on surfaces of the segments of the undoped polysilicon layer 39b of the double polysilicon layer 39, so as to form the lower electrodes.

Then, an annealing is carried out in order to grow the hemispherical silicon grains. During the annealing, phosphorus P is in the doped polysilicon layer is diffused to the undoped polysilicon layer, thereby causing a thinning phenomenon, in which the thickness of the doped polysilicon layer is reduced. In this case, the spacer nitride layer deposited in the previous step functions as a protective layer for the oxide layer, thereby suppressing formation of bridges due to loss of the oxide layer by preventing the cleaning solution from coming into the oxide layer.

Further, the spacer nitride layer disposed between the oxide layer and the polysilicon layer for the lower electrodes prevents hemispherical silicon grains from being excessively grown outward beyond the lower electrodes even when the oxide layer is lost, thereby preventing formation of bridges due to an excessive growth of the hemispherical silicon grains outward beyond the lower electrodes.

Thereafter, although not shown, a dielectric layer and an upper electrode are sequentially formed on the lower electrodes according to a known process, so that a capacitor according to the present invention is completed.

A method for forming a capacitor according to the present invention as described above has the following advantages.

Figure 4A:
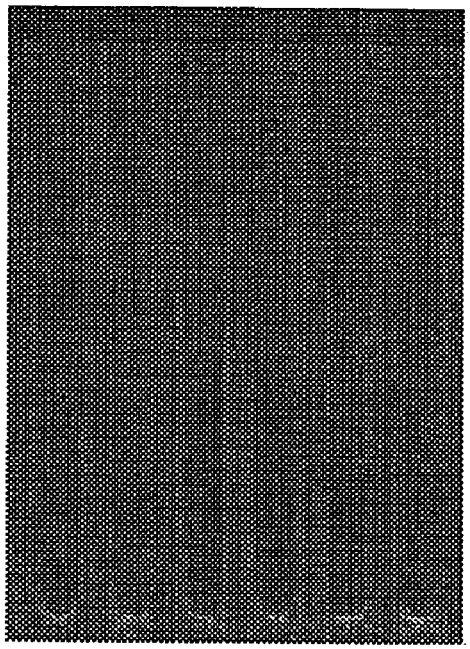
FIGS. 4a through 4i are photographs and graphs for describing advantages and effects of a method of forming a capacitor according to the present invention.

FIG. 4a is a photograph showing the contact holes which are in a state after being cleaned after being formed by etching the first and second oxide layers. Here, the first oxide layer is a PSG film containing phosphorus having a concentration of 12 mol % and the second oxide layer is a TEOS film, and the deposited first and second oxide layers have a thickness of 8000 Å and 14000 Å, respectively. Further, the contact holes were cleaned at a temperature of 65° C. by a cleaning solution containing $NH_4OH$, $H_2O_2$, and $H_2O$ mixed at a ratio of 1:2:50. In the cleaning solution, the PSG film has an etching rate of 27.2 Å/minute and the TEOS film has an etching rate of 2.9 Å/minute, and the etching selectivity of the TEOS film to the PSG film is 9.37.

In the conventional capacitor, even when the oxide layer is cleaned in order to increase the effective surface area of the lower electrodes, the lower portion of the oxide layer is not cleaned, so that the effective surface area of the lower electrodes is not actually increased. However, the capacitor according to the present invention has oxide layers of two stories and allows the first oxide layer at the lower side to be etched at a higher etching rate, so as to enable the lower portion of the oxide layer to be easily etched, thereby increasing the effective surface area of the oxide layer.

Figure 4B:
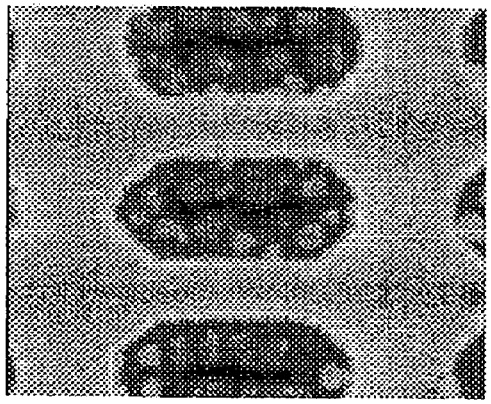
Figure 4C:
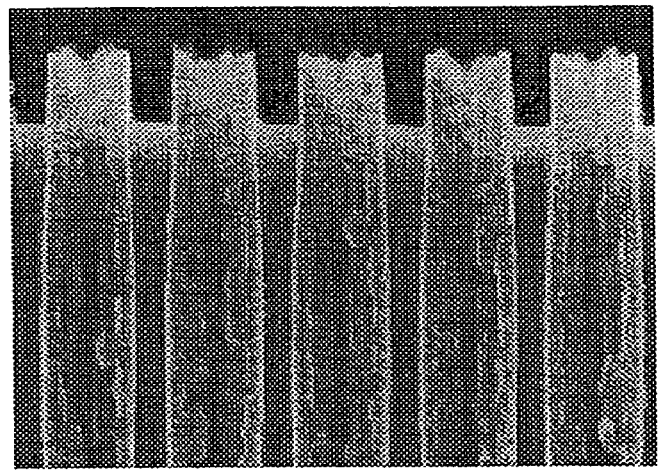

FIGS. 4b and 4c are photographs of a lamination formed on a substrate, including hemispherical silicon grains developed thereon, taken from above and side of the lamination. It is noted from FIGS. 4b and 4c that the deposited spacer nitride layer has prevented excessive growth of the hemispherical silicon grains.

Figure 4D:
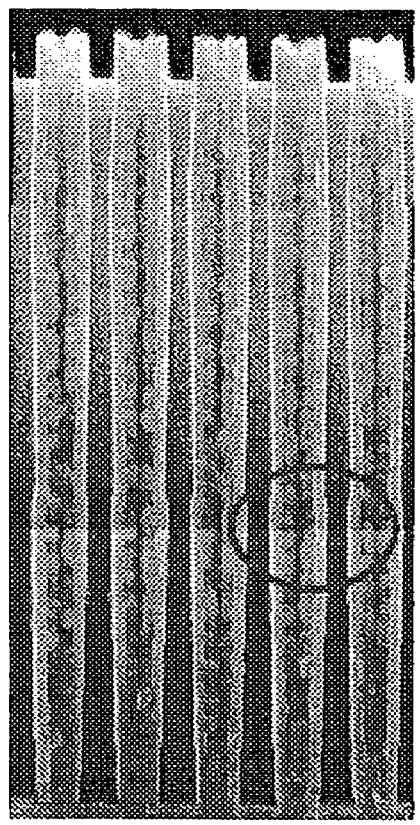
Figure 4E:
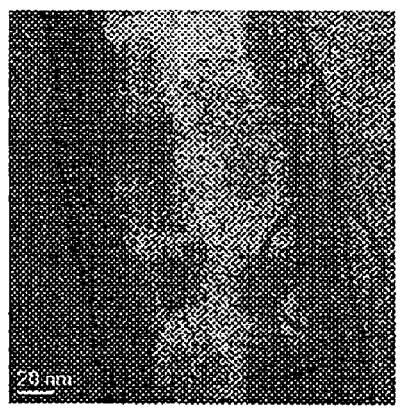
Figure 4F:
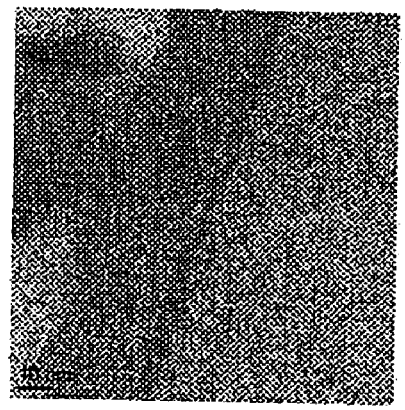

FIG. 4d is a photograph of contact holes, in which a spacer nitride layer, a doped polysilicon layer, and an undoped polysilicon layer are formed with thicknesses of 90 Å, 270 Å, and 180 Å, respectively, adjacent electrodes are separated, and hemispherical silicon grains are grown on the undoped polysilicon layer through an annealing at 650° C. FIG. 4e is an enlarged photograph of a portion of FIG. 4d, and FIG. 4f is an enlarged photograph of a portion of FIG. 4e.

Here, the spacer nitride layer functions as a protective layer for the doped polysilicon layer, thereby preventing the cleaning solution from coming into pinholes formed during the annealing for growing the hemispherical silicon grains and preventing loss of the oxide film.

Figure 4G:
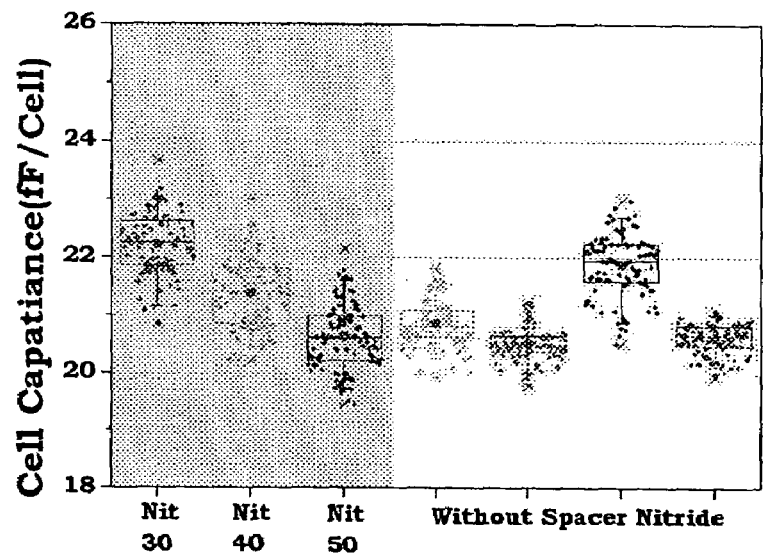
Figure 4H:
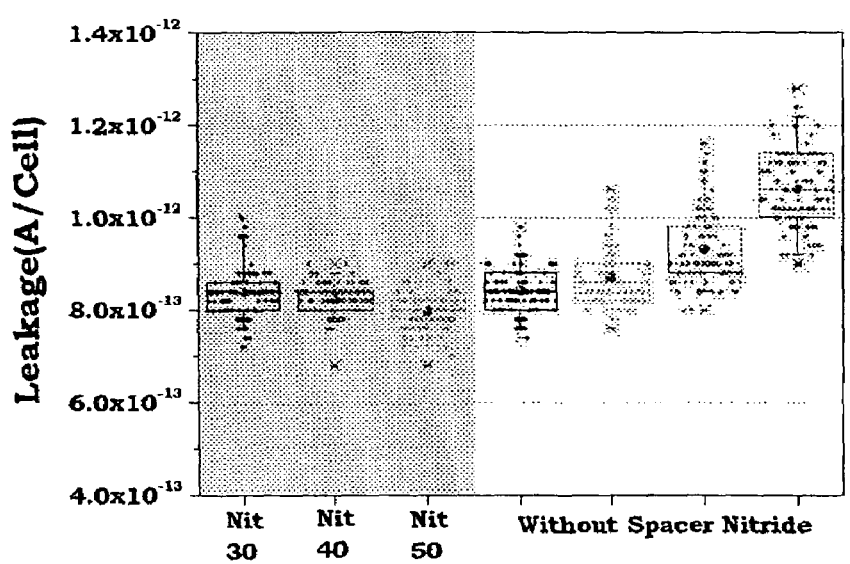
Figure 4I:
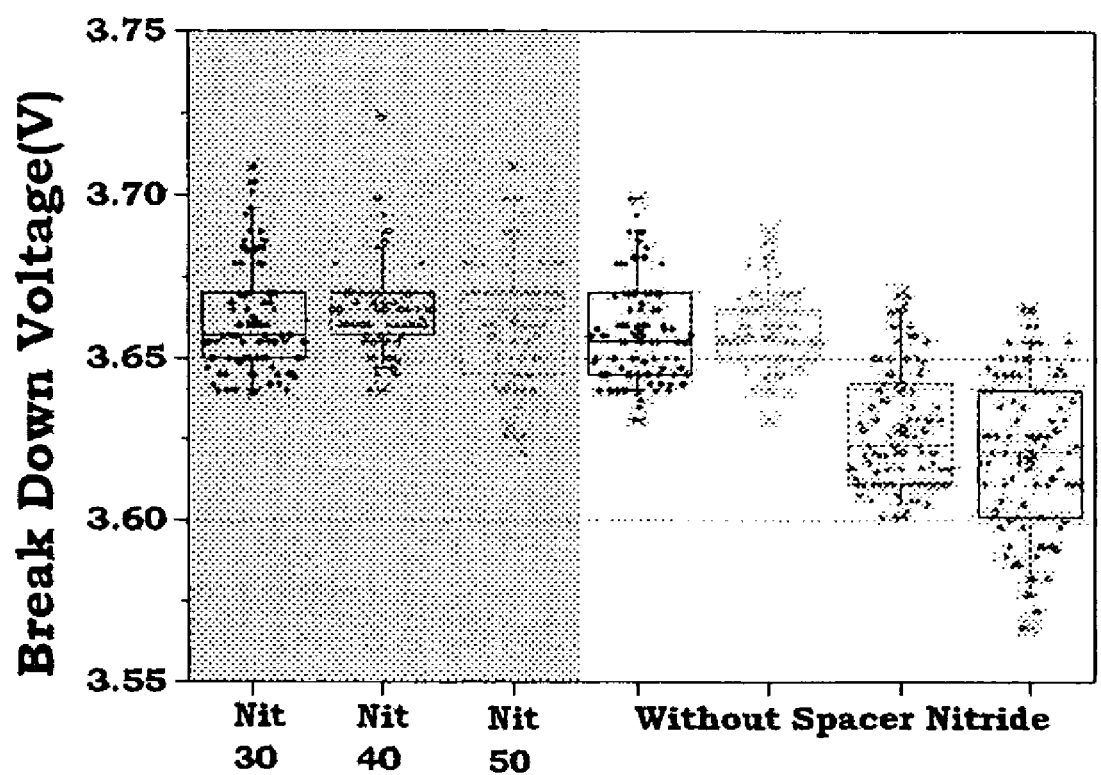

FIGS. 4g through 4i are graphs showing capacitance, leakage current, and breakdown voltage according to comparison between the cases when a spacer nitride layer is formed on an oxide layer with 30 Å, 40 Å, and 50 Å, respectively, and when no spacer nitride layer is formed.

From the graphs, it is noted that characteristics in relation to capacitance, leakage current, and breakdown voltage are improved when a spacer nitride layer is formed on an oxide layer.

In a capacitor fabricated by a method according to the present invention as described above, a spacer nitride layer deposited on an oxide layer can prevent excessive growth of hemispherical silicon grains and can prevent loss of the oxide film due to a thinning phenomenon of the doped polysilicon layer. Further, in a method according to the present invention, a capacitor oxide layer has a structure of two stories and allows a lower oxide layer to have a higher wet etching selectivity, thereby making it possible to increase an effective surface area of the lower electrodes.

Therefore, the present invention can prevent formation of bridges between the lower electrodes, can improve characteristics in relation to capacitance, leakage current, and breakdown voltage, and can secure reliability for a capacitor and a manufacturing method thereof.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a capacitor of a semiconductor device, the method comprising the steps of:
    providing a semiconductor substrate on which an insulating interlayer having plugs is formed;
    depositing an etch stop layer, a first oxide layer, and a second oxide layer in sequence on the insulating interlayer;
    etching the second oxide layer and the first oxide layer, thereby forming contact holes through which portions of the etch stop layer above the plugs are exposed;
    cleaning the contact holes by a cleaning solution having an etching selectivity, which is higher for the first oxide layer than for the second oxide layer, thereby enlarging lower portions of the contact holes;
    forming a spacer nitride layer on surfaces of the contact holes and the second oxide layer;
    removing portions of the spacer nitride layers located on the second oxide layer and above the plugs together with portions of the etch stop layer located on the plugs;
    forming a double polysilicon layer on the spacer nitride layer segments formed on surfaces of the contact holes and on the second oxide layer, the double polysilicon layer consisting of a doped polysilicon layer and an undoped polysilicon layer stacked on each other;
    applying a photoresist film on the double polysilicon layer; etching back the photoresist film and the double polysilicon layer, thereby eliminating the portions of the double polysilicon layer on the second oxide layer;
    removing the remained photoresist film; growing hemispherical silicon grains on surfaces of segments of the undoped polysilicon layer, thereby forming lower electrodes; and forming a dielectric layer and an upper electrode in sequence on the lower electrodes.

2. The method as claimed in claim 1, wherein the first oxide layer is one selected from the group consisting of a phosphor silicate glass (PSG) film, a boro-phosphor silicate glass (BPSG) film, or an undoped silicate glass (USG) film, each containing impurities, and the second oxide layer is a tetra ethyl ortho silicate (TEOS) film containing no impurity.

3. The method as claimed in claim 1, wherein the first oxide layer has a thickness smaller than 50% of a sum of thicknesses of the first oxide layer and the second oxide layer.

4. The method as claimed in claim 1, wherein the step of cleaning the contact holes includes the step of cleaning the contact holes by a solution of $NH_4OH$ having a concentration of 29 wt %, $H_2O_2$ having a concentration of 31 wt %, and deionized water $H_2O$.

5. The method as claimed in claim 4, wherein the mixture solution contains $NH_4OH$, $H_2O_2$, and $H_2O$ mixed at a volumetric ratio of 1:1.about.5:20~50.

6. The method as claimed in claim 4, wherein the mixture solution containing $NH_4OH$, $H_2O_2$, and $H_2O$ is used at a temperature between 25 and 85° C.

7. The method as claimed in claim 1, wherein, the step of cleaning the contact holes includes the step of cleaning the contact holes by HF solution diluted with $H_2O$ or isopropyl alcohol (IPA).

8. The method as claimed in claim 7, wherein, in the HF solution diluted with $H_2O$ or IPA, the ratio of HF:$H_2O$ or HF:IPA is 1:1000.about.1:10.

9. The method as claimed in claim 1, wherein, the step of forming a spacer nitride layer is comprised of the step of deposing a layer with a thickness of 30~100 Å at a temperature between 550 and 650° C. on the surfaces of the contact holes and on the second oxide layer.

* * * * *